United States Patent
Li et al.

(10) Patent No.: US 9,450,650 B2
(45) Date of Patent: Sep. 20, 2016

(54) BROADBAND CONNECTION STRUCTURE AND METHOD

(71) Applicant: National Chiao Tung University, Hsinchu (TW)

(72) Inventors: Chun-Hsing Li, Hsinchu (TW); Chien-Nan Kuo, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 18 days.

(21) Appl. No.: 14/292,388

(22) Filed: May 30, 2014

(65) Prior Publication Data

US 2015/0123749 A1    May 7, 2015

(30) Foreign Application Priority Data

Nov. 7, 2013  (TW) .............................. 102140587 A

(51) Int. Cl.
*H01P 5/02*   (2006.01)
*H04B 5/00*   (2006.01)
*H01L 23/00*  (2006.01)
*H01P 5/00*   (2006.01)

(52) U.S. Cl.
CPC ............. *H04B 5/0075* (2013.01); *H01L 24/00* (2013.01); *H04B 5/0031* (2013.01)

(58) Field of Classification Search
CPC ..... H01P 5/02; H03H 7/0115; H04B 5/0075; G08C 17/04
USPC .............. 333/24 R, 175; 340/12.51; 307/104
See application file for complete search history.

(56) References Cited

U.S. PATENT DOCUMENTS

| | | | |
|---|---|---|---|
| 6,378,774 B1 * | 4/2002 | Emori | G06K 7/10178 235/441 |
| 7,333,786 B2 * | 2/2008 | Kikuchi | G06K 7/10178 340/10.1 |
| 7,545,059 B2 * | 6/2009 | Chen | H01F 17/0006 307/412 |
| 7,714,420 B2 | 5/2010 | Gustat | |
| 8,070,070 B2 * | 12/2011 | Taniguchi | G06K 19/0723 235/492 |
| 8,366,009 B2 * | 2/2013 | Finn | G06K 19/077 235/492 |
| 8,710,964 B2 * | 4/2014 | Kaeriyama | H01L 23/48 333/24 R |
| 8,791,768 B2 * | 7/2014 | Yiu | H01L 23/48 333/24 C |
| 2005/0125093 A1 * | 6/2005 | Kikuchi | G06K 19/0723 700/213 |
| 2010/0237709 A1 * | 9/2010 | Hall | B60L 11/182 307/104 |

(Continued)

FOREIGN PATENT DOCUMENTS

TW        201110571 A    3/2011

OTHER PUBLICATIONS

Aung, Myat Thu Linn, et al., "Design of Self-Biased Fully Differential Receiver and Crosstalk Cancellation for Capacitive Coupled Vertical Interconnects in 3DICs," 2013 IEEE International Symposium, May 23, 2013, pp. 966-969.

(Continued)

*Primary Examiner* — Dean Takaoka
(74) *Attorney, Agent, or Firm* — Haynes and Boone, LLP

(57) ABSTRACT

A broadband connection structure is disclosed. The broadband connection structure includes a carrier and a chip. The carrier includes a first resonator. The chip includes a second resonator and configured on the carrier using a flip-chip method. The first resonator is connected to the second resonator via a magnetic field and an electric field existing therebetween to transmit a broadband signal between the carrier and the chip. A broadband connection method is also disclosed.

19 Claims, 16 Drawing Sheets

(56) References Cited

U.S. PATENT DOCUMENTS

| | | | |
|---|---|---|---|
| 2011/0279340 A1* | 11/2011 | Kato | G06K 19/07749 343/793 |
| 2012/0092222 A1* | 4/2012 | Kato | G08B 13/00 343/742 |
| 2014/0027520 A1* | 1/2014 | Kato | H04B 5/0075 235/492 |

OTHER PUBLICATIONS

Kanda, Kouichi, et al., "1.27Gb/s/pin 3mW/pin Wireless Superconnect (WSC) Interface Scheme," 2003 IEEE International Solid-State Circuits Conference, Session 10/High Speed Building Blocks, Paper 10.7, 2003, 3 pages.

Office Action and Patent Search Report received in Taiwanese Application No. 102140587, dated Oct. 23, 2015, 7 pages.

* cited by examiner

BROADBAND CONNECTION STRUCTURE AND METHOD

CROSS REFERENCE TO RELATED APPLICATIONS

The application claims the benefit of Taiwan Patent Application No. 102140587, filed on Nov. 7, 2013, at the Taiwan Intellectual Property Office, the disclosure of which is incorporated herein in its entirety by reference.

FIELD OF THE INVENTION

The present disclosure relates to a broadband connection structure, specifically to a broadband connection structure for connecting a chip and a carrier or a chip and another chip.

BACKGROUND OF THE INVENTION

Wire bonding is a conventional method of making connections between a chip and a carrier or a chip and another chip. However, a relatively high inductance of wire bonds will lead to bandwidth limitations for the signal transmissions. Therefore, wire bonding is commonly used in a structure that transmits low-frequency signals.

Please refer to FIG. 1, which is a schematic diagram showing a connection structure 10 in the prior art. The connection structure 10 includes chips 104 and 106 and material 108, wherein the chip 104 is electrically connected to the chip 106 using a ribbon structure 102. However, in this connection mode, the two chips must be at the same height and thus the additional material 108 is usually added under the thinner chip 106 in an additional step during the manufacturing process, which causes increased cost. Although the inductance of the ribbon structure 102 is lower than that of the wire bonds, for transmissions of high-frequency and broadband signals, the operable frequency range is still limited (e.g. less than 100 GHz) due to the high inductance of the ribbon structure 102.

Please refer to FIG. 2, which is a schematic diagram showing a connection structure 20 in the prior art. The connection structure 20 includes a carrier 204, a chip 202 stacked on the carrier 204 using a flip-chip method, and a connecting unit 206, e.g. a bumper, configured on a connecting face 208 of the chip 202. The connecting unit 206 is capable of connecting the chip 202 and the carrier 204 after being heated and pressed, and via which signals between the chip 202 and the carrier 204 can be transmitted. When the connecting unit 206 is a bumper, the large size thereof will cause a severe parasitic effect, and thus the operable bandwidth of signal transmissions between the chip 202 and the carrier 204 is limited.

Please refer to FIG. 3, which is a schematic diagram showing a connection structure 30 in the prior art. In the connection structure 30, the chip and the carrier share the same substrate. The connection structure 30 includes connecting pads 301 and 302, conducting wires 303 and 304, equivalent loads 305 and 306, and wire bonds 307 and 308 connecting the connecting pad 301 to the connecting pad 302. Typically, the connecting pads 301 and 302 have a width of 200 μm, the conducting wires 303 and 304 have a length of 190 μm and a width of 100 μm, the wire bonds 307 and 308 have a width of 25 μm and a length of 32 μm, and the distance between the connecting pads 301 and 302 is about 225 μm. The equivalent loads 305 and 306 are preferably 50 ohm. In the connection structure 30, the conducting wires 303 and 304 are used as equivalent inductors, and the connecting pads 301 and 302 are used as equivalent capacitors. The microwave circuit 3012 includes the equivalent load 305, the conducting wire 303 and the connecting pad 301. The microwave circuit 3013 includes the equivalent load 306, the conducting wire 304 and the connecting pad 302. The connection structure 30 can realize a low-pass filter of orders 1 through 5 and transmit signals between two microwave circuits 3012 and 3013 via the wire bonds 307 and 308.

Unfortunately, such connection structure 30 has a large area and high cost, so it can be applied to neither signal transmission between two separate chips, nor that between an independent chip and an independent carrier. Furthermore, the connection structure 30 has the parasitic effect due to the difference between the ground potentials of the microwave circuit 3012 and 3013, and thus the bandwidth for signal transmissions is limited.

Please refer to FIG. 4, which is a schematic diagram showing a package structure 40 for transmitting signals in the THz frequency band in the prior art. The package structure 40 includes a chip 401 and a waveguide 403. The chip 401 includes a chip body 4010 and a dipole antenna 402. In the package structure 40, signals from the chip body 4010 can be radiated to the waveguide 403 via the dipole antenna 402. The waveguide 403 can be further connected to other chips or carriers to transmit signals in the THz frequency band. Although the package structure 40 has a less insertion loss, the dipole antenna 402 on the chip body 4010 usually occupies a large area and thus causes an increase in cost. Due to the large volume of the waveguide 403, which typically has a length L1 of about 1000 μm, a width W1 of about 600 μm and a height H1 of about 600 μm, the package structure 40 cannot be used to realize the miniaturized terahertz signal transmission system, and cannot be placed in handheld electronic products.

Please refer to FIG. 5, which is a schematic diagram of a transmission device 50 in the prior art. The transmission device 50 includes chips 501, 502 and 503 and spacer layers 504 and 505. The spacer layer 504 is located between chips 501 and 502, and the spacer layer 505 is located between chips 502 and 503. The chip 501 includes a transmitting circuit 5011, a receiving circuit 5012, a transmitting coil 5013 and a receiving coil 5014 on the top surface thereof as indicated in FIG. 5. Similarly, the chip 502 includes a transmitting circuit 5021, a receiving circuit 5022, a transmitting coil 5023 and a receiving coil 5024, and the chip 503 includes a transmitting circuit 5031, a receiving circuit 5032, a transmitting coil 5033 and a receiving coil 5034.

In FIG. 5, the transmitting coil 5013 and the receiving coil 5024 can convey digital signals via inductive coupling, and the digital signals are decoded in the receiving circuit 5022. However, the high attenuation of the transmission device 50 in the intensity of the transmitted digital signals is unsuitable for applications using connection structures, and due to a relatively narrow range of data transmission bandwidth, signal transmissions in the THz frequency band or millimetric wave band cannot be achieved. Because of the high signal attenuation, the amplitude of the signals output by the transmitting circuit must be large enough to allow the receiving circuit to demodulate the digital signals correctly. Based on this aspect, the transmission device 50 uses both the transmitting circuit and the receiving circuit to effectively convey signals, but this has the disadvantages of high cost and high power consumption. Furthermore, the transmission device 50 has another disadvantage, the need of thinning the chips 501, 502 and 503, and thus an additional process is required. Based on the above, the high-cost transmission device 50 is not a good choice for transmissions between a chip and a carrier or between chips.

Please refer to FIG. 6, which is a schematic diagram showing a near field communication (NFC) system 60 in the prior art. The system 60 includes resonators 601 and 602, wherein the resonator 601 includes a ring conductor 6011 and an equivalent capacitor 6012, and the resonator 602 includes a ring conductor 6021 and an equivalent capacitor 6022. The resonators 601 and 602 are separated by a distance D, which is generally at least larger than thousands of μm. Because the NFC system 60 transmits power using a near field method, the resonators 601 and 602 are required to have large quality factors, e.g. over 100, but it is hard to generate a high quality factor for the transmissions between a chip and a carrier or between chips. In addition, the NFC system 60 has a narrow operable bandwidth (tens of MHz) and a bulky size. Therefore, the NFC system 60 is not a good choice for transmissions between a chip and a carrier or between chips.

To overcome the problems mentioned above, a novel broadband connection structure and method are disclosed in the present disclosure after a lot of research, analysis and experiments by the inventors.

SUMMARY OF THE INVENTION

In accordance with one aspect of the present disclosure, a broadband connection structure is disclosed. The broadband connection structure comprises a carrier and a chip. The carrier includes a first resonator, and the chip includes a second resonator and is configured on the carrier using a flip-chip method. The first resonator is connected to the second resonator via a magnetic field and an electric field existing therebetween to transmit a broadband signal between the carrier and the chip.

In accordance with another aspect of the present disclosure, a broadband connection structure is disclosed. The broadband connection structure includes a first chip including a first resonator and a second chip including a second resonator and placed on the first chip using a flip-chip method. The first resonator is coupled to the second resonator via a magnetic field and an electric field existing therebetween to transmit a broadband signal between the first chip and the second chip.

In accordance with a further aspect of the present disclosure, a broadband connection method is disclosed. The method includes steps of configuring a first resonator on a carrier and a second resonator on a chip, and forming a resonant coupling network via a magnetic coupling and an electric coupling between the first resonator and the second resonator to transmit a broadband signal between the carrier and the chip.

The above objectives and advantages of the present disclosure will become more readily apparent to those ordinarily skilled in the art after reviewing the following detailed descriptions and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments in this disclosure are presented herein for the purposes of illustration and description only; it is not intended to be exhaustive or to be limited to the precise form disclosed.

Figure 1:
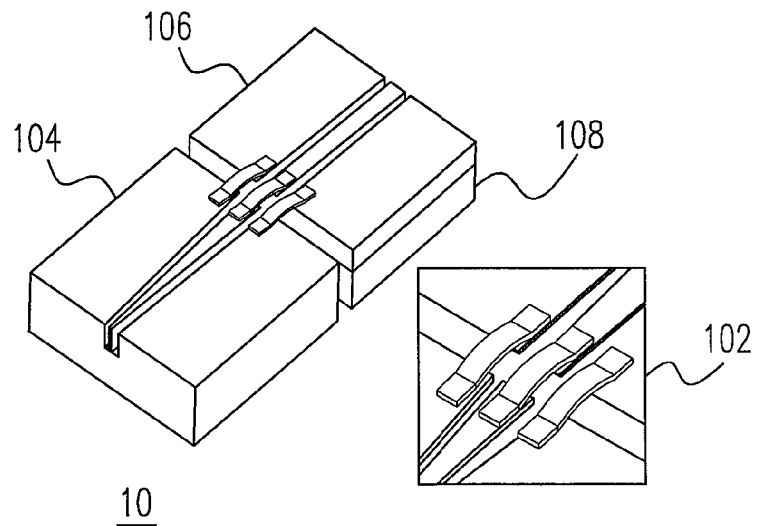
FIG. 1 is a schematic diagram showing a connection structure in the prior art.
Figure 2:
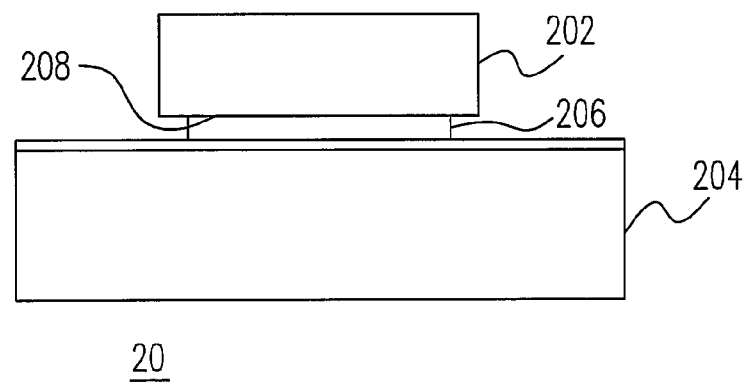
FIG. 2 is a schematic diagram showing another connection structure in the prior art.
Figure 3:
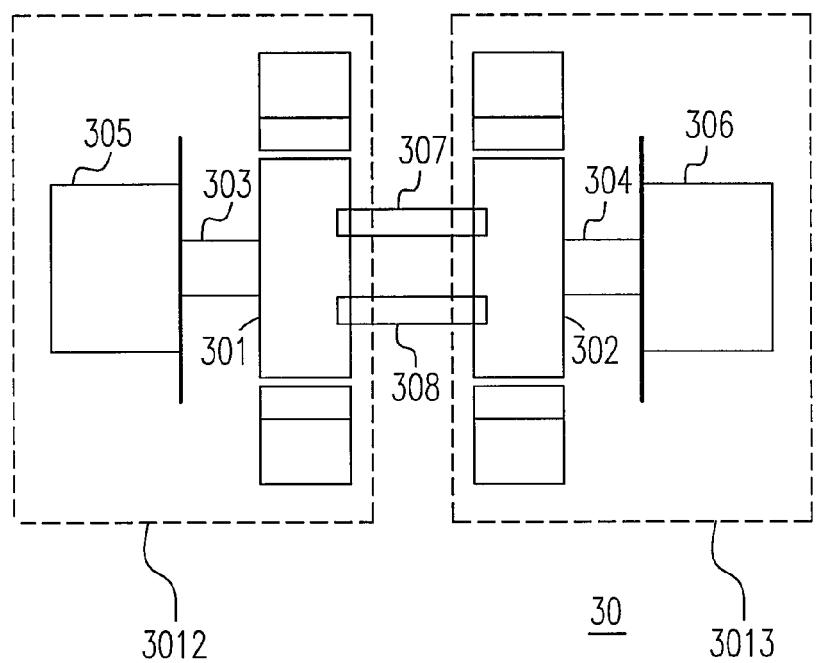
FIG. 3 is a schematic diagram showing another connection structure in the prior art.
Figure 4:
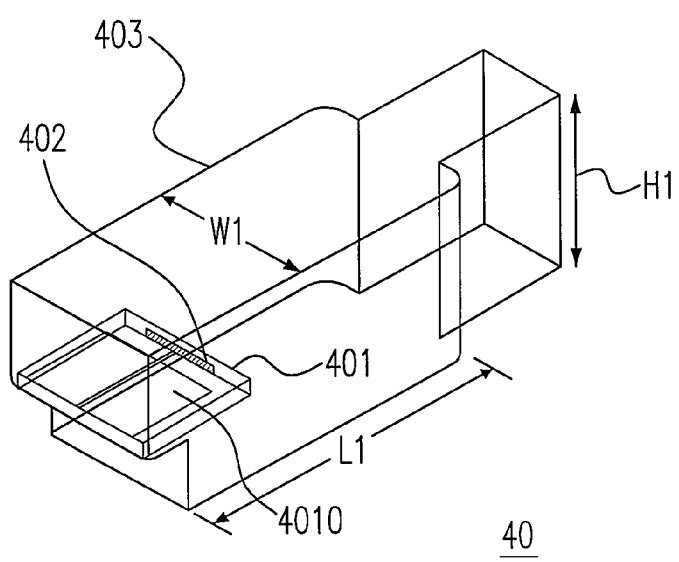
FIG. 4 is a schematic diagram showing a package structure for transmitting signals in the THz frequency band in the prior art.
Figure 5:
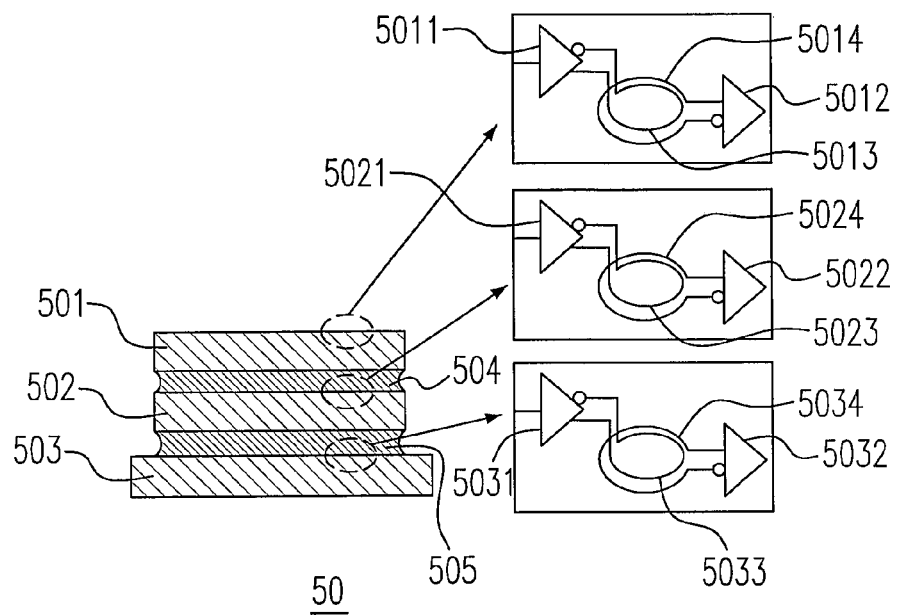
FIG. 5 is a schematic diagram of a transmission device in the prior art.
Figure 6:
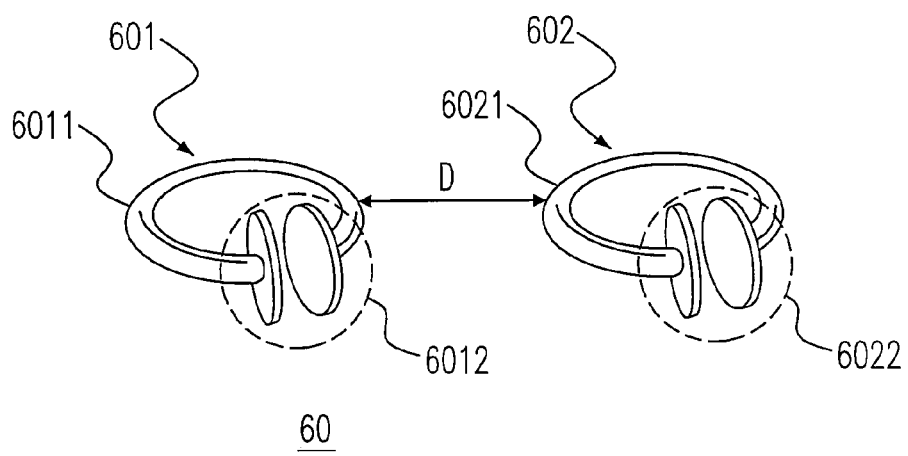
FIG. 6 is a schematic diagram showing a near field communication (NFC) system in the prior art.
Figure 7A:
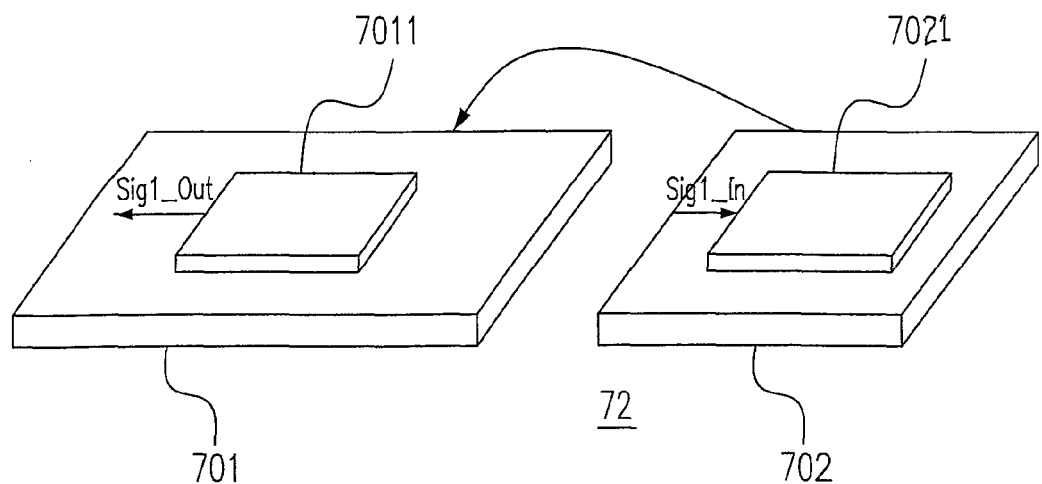
FIG. 7(a) is a schematic diagram showing a connection structure for a chip and a carrier according to a first preferred embodiment of the present disclosure.
Figure 7B:
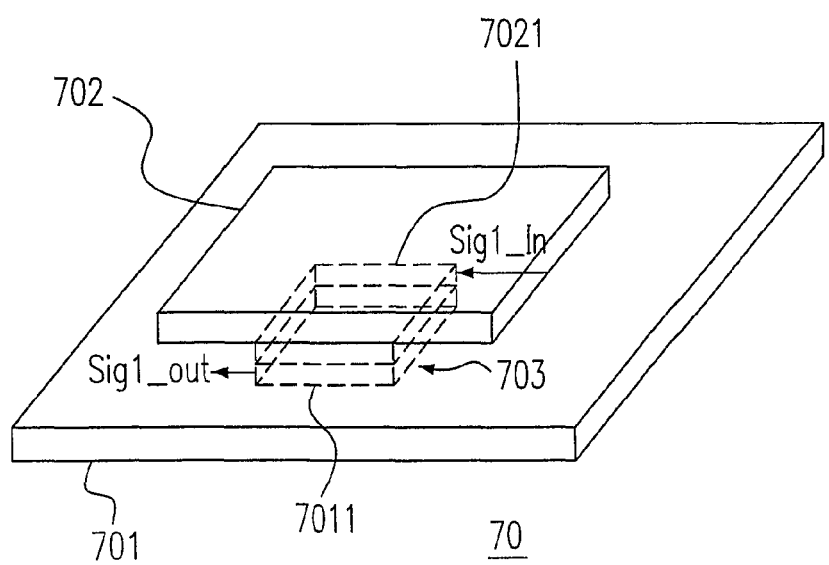
FIG. 7(b) is a schematic diagram showing a broadband connection structure according to the first preferred embodiment of the present disclosure.

Please refer to FIG. 7(a), which is a schematic diagram showing a connection structure 72 for a chip and a carrier according to a first preferred embodiment of the present disclosure. The connection structure 72 includes a carrier 701 and a chip 702. The carrier 701 includes a first resonator 7011, and the chip 702 includes a second resonator 7021. The chip 702 is stacked on the carrier 701 using a flip-chip method to form a broadband connection structure 70, as shown in FIG. 7(b). A broadband signal Sig1_In is input into the second resonator 7021, and then a broadband signal Sig1_Out is output from the first resonator 7011. Preferably, the broadband signals Sig1_In and Sig1_Out are differential signals.

Please refer to FIG. 7(b), which is a schematic diagram showing a broadband connection structure 70 according to the first preferred embodiment of the present disclosure. The chip 702 may be fixed to the carrier 701 by a connecting pad (not shown) on the carrier 701 and a solder ball on the chip 702. After the chip 702 is flipped and fixed on the carrier 701, the second resonator 7021 and the first resonator 7011 form a resonant coupling network 703. The transmissions of the broadband signals Sig1_In and Sig1_Out are achieved by using magnetic field coupling of equivalent inductors, electric field coupling of equivalent capacitors and the resonant coupling network 703, which will be detailed hereafter.

Figure 7C:
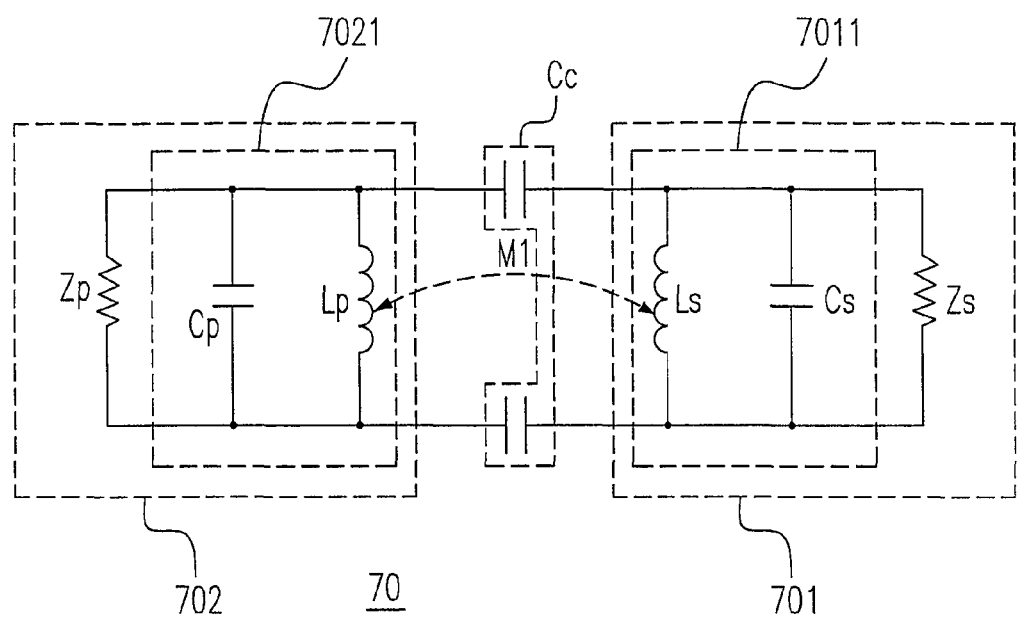
FIG. 7(c) is a schematic diagram showing an equivalent circuit of the broadband connection structure according to the first preferred embodiment of the present disclosure.

Please refer to FIG. 7(c), which is a schematic diagram showing an equivalent circuit of the broadband connection structure 70 in FIG. 7(b) according to the first preferred embodiment of the present disclosure. The chip 702 includes a load $Z_P$, an equivalent inductor $L_P$ and an equivalent capacitor $C_P$. The carrier 701 includes a load $Z_S$, an equivalent inductor $L_S$ and an equivalent capacitor $C_S$. The second resonator 7021 includes the equivalent inductor $L_P$ and the equivalent capacitor $C_P$, and the first resonator 7011 includes the equivalent inductor $L_S$ and the equivalent capacitor $C_S$. When the chip 702 is configured on the carrier 701 using a flip-chip method, the first resonator 7011 and the second resonator 7021 are separated by a gap to form an equivalent capacitor $C_C$ in FIG. 7(c). The equivalent capacitor $C_C$ uses an electric field formed between the chip 702 and the carrier 701 to couple the broadband signals Sig1_In and Sig1_Out. The equivalent inductors $L_P$ and $L_S$ use a magnetic field formed between the chip 702 and the carrier 701 to couple the broadband signals Sig1_In and Sig1_Out.

Figure 8A:
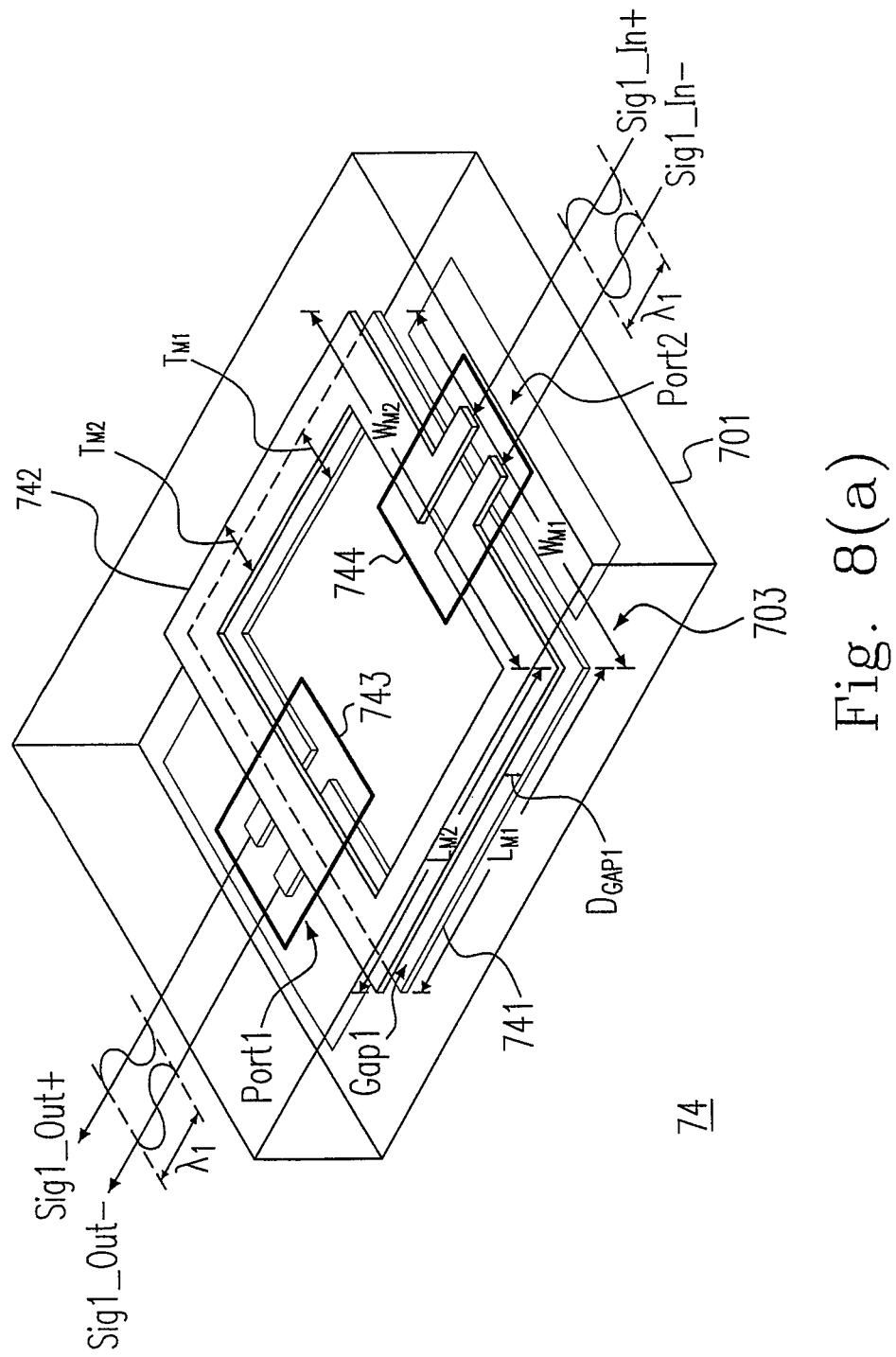
FIG. 8(a) is a schematic diagram showing a broadband connection structure according to the first preferred embodiment of the present disclosure.
Figure 8B:
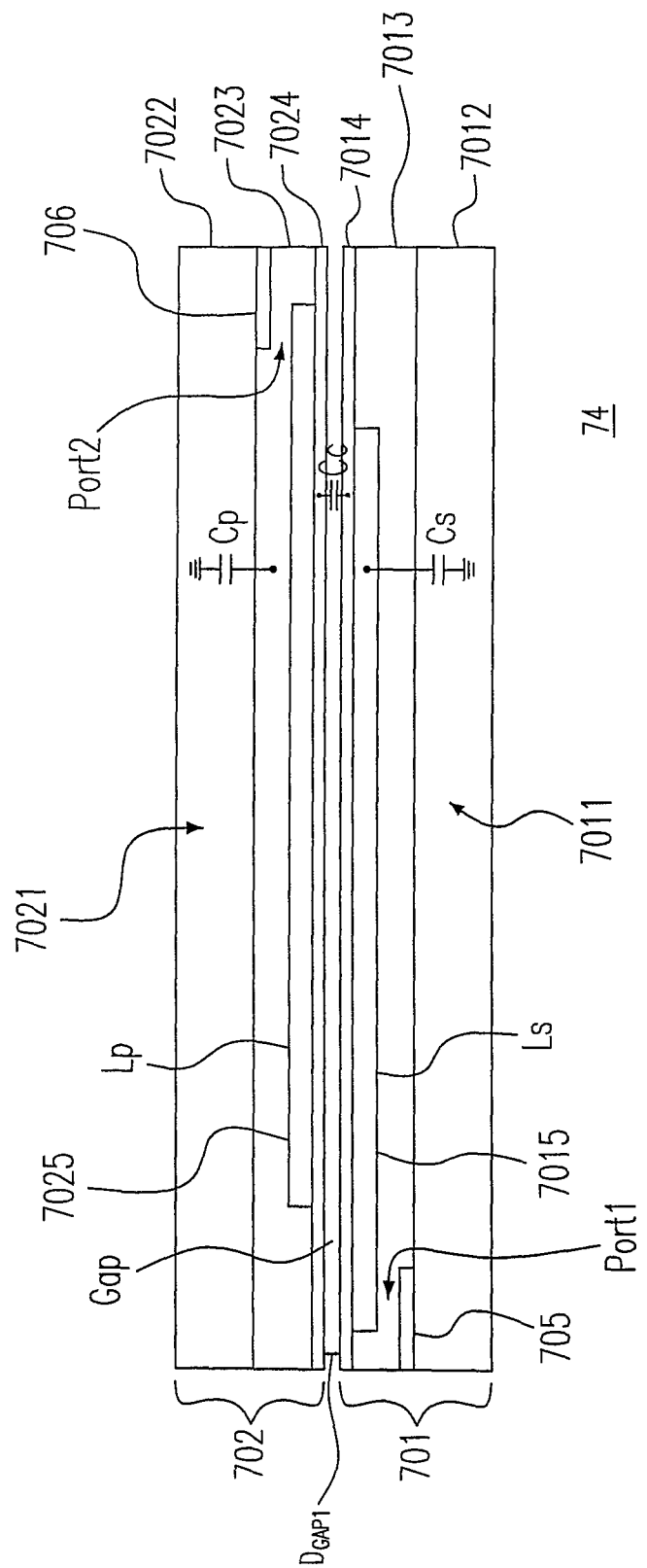
FIG. 8(b) is a cross-sectional diagram showing a broadband connection structure according to the first preferred embodiment of the present disclosure.

Please refer to FIGS. 8(a) and 8(b), which are respectively a schematic diagram and a cross-sectional diagram showing a broadband connection structure 74 according to the first preferred embodiment of the present disclosure. The broadband connection structure 70 in FIG. 7(b) can be realized by the broadband connection structure 74 in FIG. 8(a). In FIGS. 8(a) and 8(b), the broadband connection structure 74 includes a carrier 701 and a chip 702 configured on the carrier 701 using a flip-chip method. The carrier 701 includes a first resonator 7011, and the chip 702 includes a second resonator 7021. The first resonator 7011 includes a first split-rectangular conducting wire 741, which has a width $W_{M1}$ and a length $L_{M1}$. The second resonator 7021 includes a second split-rectangular conducting wire 742, which has a width $W_{M2}$ and a length $L_{M2}$. The first split-rectangular conducting wire 741 and the second split-rectangular conducting wire 742 are concentric, split and referred to as "split rings" despite their rectangular shape. Specifically, although the first split-rectangular conducting wire 741 and the second split-rectangular conducting wire 742 are shaped like rectangles, they are not limited to that shape. There is a magnetic field and an electric field between the first resonator 7011 and the second resonator 7021, through which the first resonator 7011 is coupled to the second resonator 7021 to form the resonant coupling network 703 to transmit the broadband signal Sig1_In or Sig1_Out between the carrier 701 and the chip 702. The carrier 701 and the chip 702 are separated by a gap denoted as "Gap1" in FIG. 8(a). The distance of Gap1 ($D_{GAP1}$) is small enough to generate the magnetic field coupling and the electric field coupling between the chip 702 and the carrier 701. Preferably, the distance $D_{GAP1}$ is about several μm to about tens μm.

In FIG. 8(a), the broadband signal Sig1_In is an alternating current (AC) signal, which may be composed of differential signals Sig1_In+ and Sig1_In−. The width $W_{M1}$ or the length $L_{M1}$ is preferably equal to or smaller than ⅕ of a wavelength λ1 to which a lowest frequency in the operable bandwidth corresponds. For example, the value of the width $W_{M1}$ or the length $L_{M1}$ is in a range of ⅕ to ¹⁄₁₀ of the wavelength λ1. Therefore, the size of either the first split-rectangular conducting wire 741 or the second split-rectangular conducting wire 742 is quite small, which will facilitate chip packaging for mobile devices. The common length of wire antennas transmitting signals via electromagnetic waves is equal to ½ or ¼ of the wavelength for the signal transmission to obtain optimal impedance matching. In the present disclosure, signals are transmitted by the magnetic field coupling and the electric field coupling, and the width $W_{M1}$ or the length $L_{M1}$ of the wire can be smaller than ⅕ of the wavelength of the signal transmission or even less. In this aspect, the package structure for the chip 702 is minimized because no large-sized antenna is integrated in the chip 702. The first split-rectangular conducting wire 741 and the second split-rectangular conducting wire 742 may have other shapes, e.g. circular, elliptical or polygonal shapes. Preferably, they have the same and symmetric shape, which will be conducive for the chip 702 and the carrier 701 to have the same virtual ground potential. Similarly, the broadband signal Sig1_Out is an AC signal and may be composed of differential signals Sig1_Out+ and Sig1_Out−. The differential signals Sig1_In+ and Sig1_In− are input from Port2 and pass through the resonant coupling network 703, and afterward, the differential signals Sig1_Out+ and Sig1_Out− are output from Port1.

In FIG. 8(b), the chip 702 includes a substrate 7022, a dielectric layer 7023, a conducting layer 7025 and a passivation layer 7024. Preferably, the conducting layer 7025 is a metal layer, which is usually a top metal layer in the semiconductor fabrication process. The passivation layer 7024 is used to prevent the surface of the conducting layer 7025 from a chemical reaction, which may corrode the chip 702. Similarly, the carrier 701 includes a substrate 7012, a dielectric layer 7013, a conducting layer 7015 and a passivation layer 7014. Preferably, the conducting layer 7015 is a metal layer. The passivation layer 7014 is used to prevent the carrier 701 from corrosion caused by a chemical reaction on the surfaces of the conducting layer 7015. The metal layer 7025 includes the second split-rectangular conducting wire 742 forming the equivalent inductor $L_P$. The metal layer 7015 includes the first split-rectangular conducting wire 741 forming the equivalent inductor $L_S$. The equivalent inductor $L_P$ and the equivalent inductor $L_S$ couple the broadband signals Sig1_In and Sig1_Out via the magnetic field existing therebetween. The dielectric layers 7013 and 7023 include grounding pads 705 and 706 electrically connected to the end of the ground potential.

Please refer to FIGS. 8(a) and 8(b). The second split-rectangular conducting wire 742, the insulating layer 7023 and the substrate 7022 form the equivalent capacitor $C_P$. Alternatively, the chip 702 can use the parasitic capacitance of the second split-rectangular conducting wire 742 to form the equivalent capacitor $C_P$. Similarly, the first split-rectangular conducting wire 741, the insulating layer 7013 and the substrate 7012 form the equivalent capacitor $C_S$. Alternatively, the equivalent capacitor $C_S$ can be formed from the parasitic capacitance of the first split-rectangular conducting wire 741. The equivalent inductor $L_S$ and the equivalent capacitor $C_S$ are included in the first resonator 7011, and the equivalent inductor $L_P$ and the equivalent capacitor $C_P$ are included in the second resonator 7021. The first split-rectangular conducting wire 741, the Gap1 and the second split-rectangular conducting wire 742 constitute the equivalent capacitor $C_C$ to couple the broadband signals Sig1_In and Sig1_Out via the electric field.

In FIG. 8(a), the first split-rectangular conducting wire 741 has a symmetric shape and a symmetric conducting structure 743, and the second split-rectangular conducting wire 742 has a symmetric shape and a symmetric conducting structure 744 as well. The differential signals Sig1_In+ and Sig1_In− are input to the symmetric conducting structure 744 and coupled to the symmetric conducting structure 743 via the magnetic field and the electric field, and finally the differential signals Sig1_Out+ and Sig1_Out− are output from the symmetric conducting structure 743. Alternatively, the differential signals Sig1_In+ and Sig1_In− can be input to the symmetric conducting structure 743 and coupled to the symmetric conducting structure 744 via the magnetic field and the electric field, and finally the differential signals Sig1_Out+ and Sig1_Out− are output from the symmetric conducting structure 744. The equivalent inductances VLP and VLS of the equivalent inductors $L_P$ and $L_S$ and the equivalent capacitance VC of the equivalent capacitor $C_C$ can be adjusted to allow the operable bandwidth of this structure to cover the desired frequency band, such as the millimetric wave band or the THz frequency band. The equivalent inductance VLS can be adjusted by changing the width $W_{M1}$ and the length $L_{M1}$ of the first split-rectangular conducting wire 741, and the equivalent inductance VLP can be adjusted by changing the width $W_{M2}$ and the length $L_{M2}$ of the second split-rectangular conducting wire 742. The equivalent capacitance VC can be adjusted by changing the thickness $T_{M1}$ of the first split-rectangular conducting wire 741 and the thickness $T_{M2}$ of the second split-rectangular conducting wire 742. The thickness $T_{M1}$ and the thickness $T_{M2}$ are associated with areas of two plates constituting the equivalent capacitor $C_C$. One skilled in the art knows that the capacitance of parallel plate capacitors is given by $C=\in \times A \div d$, where $\in$ is permittivity of the dielectric between two parallel plates, A is the area of the plates, and d is the separation distance between the two parallel plates. Therefore, the equivalent capacitance VC of the equivalent capacitor $C_C$ can be adjusted using the variables mentioned in the above equation. Because the broadband connection structure 74 does not realize a substantial connection to transmit the broadband signals Sig1_In and Sig1_Out, the chip 702 and the carrier 701 in FIG. 8(b) can be made of the same or different materials and do not need to share an identical substrate. That is, the substrate 7012 and the substrate 7022 in FIG. 8(b) may be made of the same or different materials, which increases flexibility in the fabrication process.

Figure 8C:
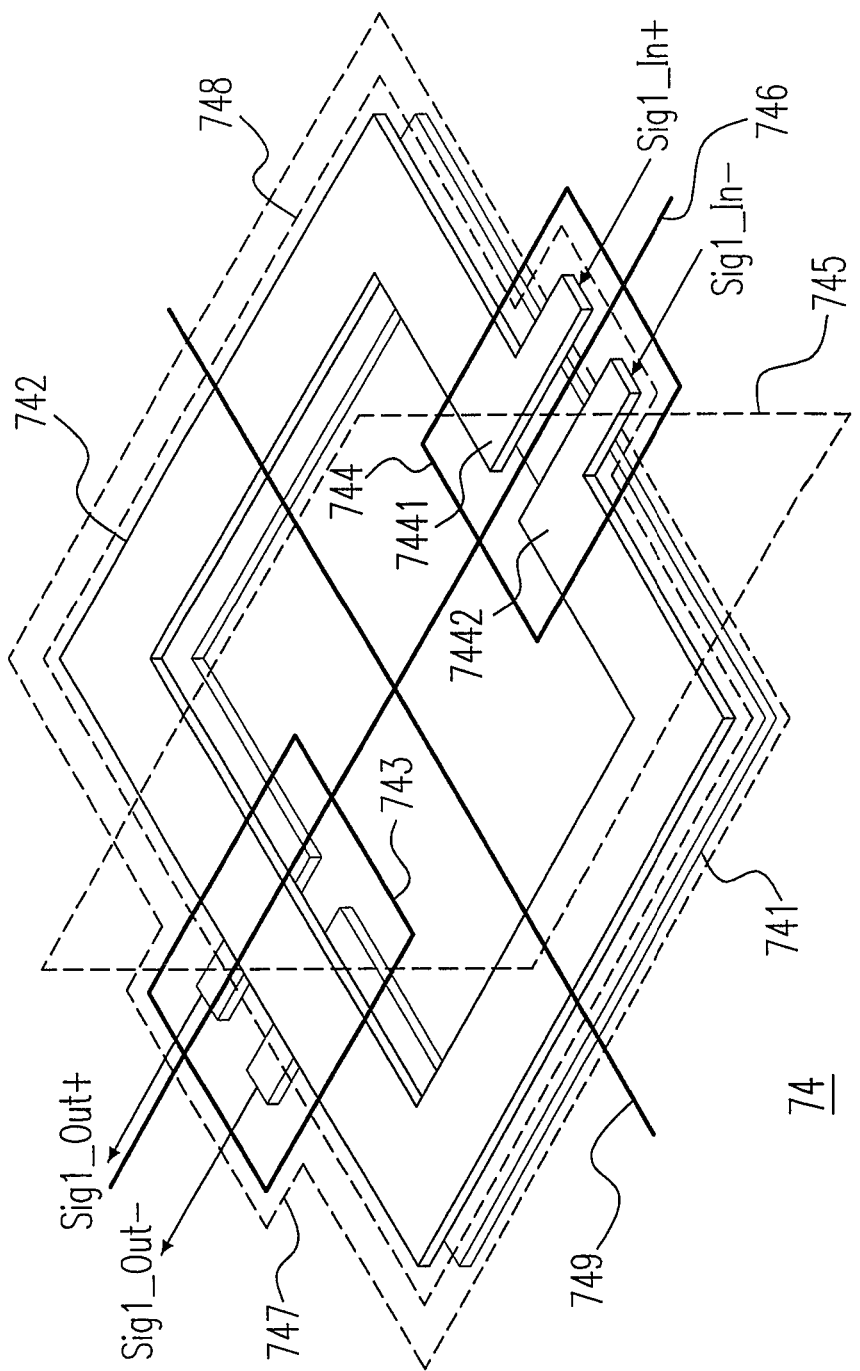
FIG. 8(c) is a schematic diagram showing a virtual ground plane of the broadband connection structure in FIG. 8(a).

Please refer to FIG. 8(c), which is a schematic diagram showing a virtual ground plane 745 of the broadband connection structure 74. The first split-rectangular conducting wire 741 includes a first symmetric portion 747, and the second split-rectangular conducting wire 742 includes a second symmetric portion 748. The virtual ground plane 745 is perpendicular to the first split-rectangular conducting wire 741 and the second split-rectangular conducting wire 742. Each of the first symmetric portion 747 and the second symmetric portion 748 is symmetric with respect to the virtual ground plane 745 so that the carrier 701 and the chip 702 have an identical ground potential, which can prevent any parasitic effect generated between the carrier 701 and the chip 702. Also, each of the symmetric conducting structures 743 and 744 is axially symmetric with respect to an axis 746 included in the virtual ground plane 745. The first split-rectangular conducting wire 741 and the second split-rectangular conducting wire 742 are concentrically stacked and the stacked structure is symmetric with respect to an axis 749. When the signal Sig1_In+ of the differential signals Sig1_In+ and Sig1_In− has a voltage of V1_In+, and the other signal Sig1_In− in the differential signals has a voltage of V1_In−, the ground potential formed on the virtual ground plane 745 is equal to V1_In+−V1_In−. Similarly, when the signal Sig1_Out+ in the differential signals Sig1_Out+ and Sig1_Out− has a voltage of V1_Out+, and the signal Sig1_Out− has a voltage of V1_Out−, the ground potential formed on the virtual ground plane 745 is equal to V1_Out+−V1_Out−. The voltages at turns 7441 and 7442 of the symmetric conducting structure 744 are respectively V2_In+ and V2_In−, which are different from the voltages V1_In+ and V1_In− due to the inductive effect. Because of the small Gap1 (as shown in FIG. 8(a)), the voltages at the turns 7441 and 7442 have a tiny difference, which is small enough to be ignored, from those of portions of the first split-rectangular conducting wire 741 directly below the turns 7441 and 7442. Therefore, for the second split-rectangular conducting wire 741 and the first split-rectangular conducting wire 742, the voltage on the virtual ground plane 745 near the turns 7441 and 7442 and that on the virtual ground plane 745 near the portions of the first split-rectangular conducting wire 741 directly below the turns 7441 and 7442 can be considered an identical ground potential.

Figure 9:
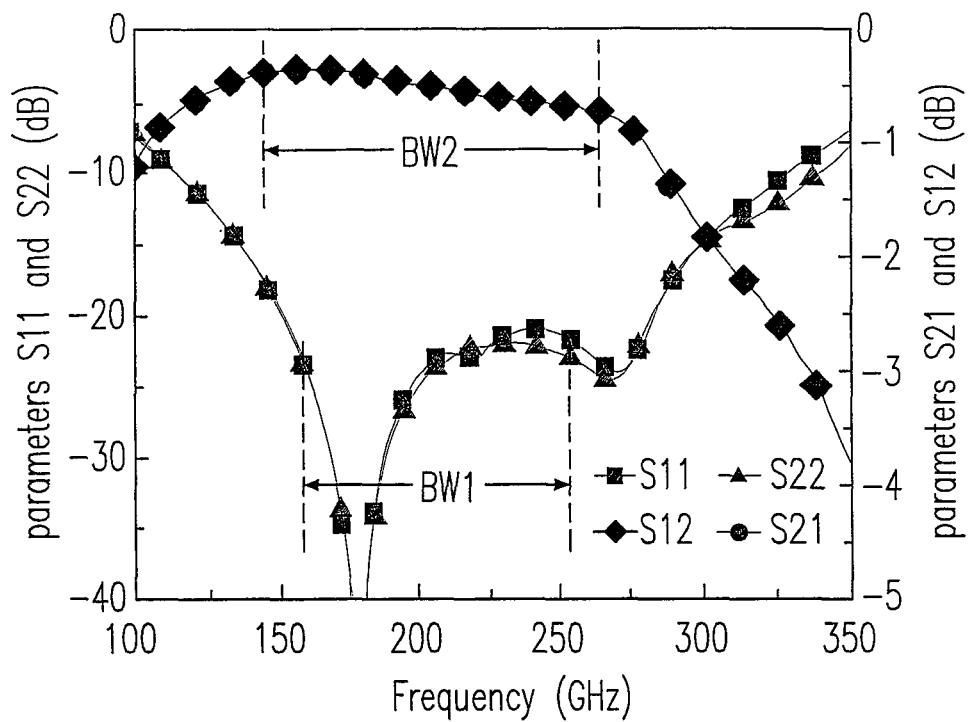
FIG. 9 is a schematic diagram showing scattering-parameters of a resonant coupling network of the first preferred embodiment of the present disclosure.

Please refer to FIG. 9, which is a schematic diagram showing scattering-parameters of the resonant coupling network 703 of the first preferred embodiment of the present disclosure. In this case, the defined bandwidth is in a range of 150 GHz to 250 GHz, while other operation frequency ranges can be realized as well by similar methods described in this disclosure. In FIG. 9, the horizontal axis shows the operation frequency in unit of GHz of the broadband signals Sig1_In and Sig1_Out. The vertical axis represents a return loss or gain of parameters S11, S22, S21 and S12 in unit of GHz, which are respectively denoted by rectangles, triangles, diamonds and circles. The parameters S11, S22, S21 and S12 respectively represent forward return loss, reverse return loss, forward gain and reverse gain of the resonant coupling network 703.

In FIG. 9, the parameter S11 is smaller than −25 dB in the frequency band BW1 (about 150 GHz to 250 GHz), which means that when the broadband signal Sig1_In is input from Port2 (as shown in FIG. 8(b)), the forward return loss generated in the frequency band BW1 is low. Namely, during the transmission of the broadband signal Sig1_In in the frequency band BW1, the forward return loss is small. The parameter S21 is larger than −1 dB in the frequency band BW2 (about 140 GHz~260 GHz), which means that when the broadband signal Sig1_In is input from Port2, the forward gain generated in the frequency band BW2 is large. Namely, the energy loss is less than 1 dB after the broadband signal Sig1_In is transmitted from the chip 702 to the carrier 701, which is particularly beneficial for the forward transmissions of the broadband signals Sig1_In and Sig1_Out. Similarly, the parameter S22 is smaller than −25 dB in the frequency band BW1, which means that when the broadband signal Sig1_Out is input from Port1 (as shown in FIG. 8(b), the reverse return loss in the frequency band BW1 is low. Namely, during the transmission of the broadband signal Sig1_Out in the frequency band BW1, the reverse return loss is small. The parameter S12 is larger than −1 dB in the frequency band BW2, which means that when the broadband signal Sig1_Out is input from Port1, the reverse gain generated in the frequency band BW2 is large. The energy loss less than 1 dB after the transmission of the broadband signal Sig1_Out from the carrier 701 to the chip 702 is particularly beneficial for the reverse transmissions of the broadband signals Sig1_In and Sig1_Out. As shown in FIG. 9, preferred transmission properties can be obtained in the intersection region (about 150 GHz~250 GHz) of the frequency bands BW1 and BW2. Based on the above, it can be seen that bi-directional transmission of the broadband signals Sig1_In and Sig1_Out between the chip 702 and the carrier 701 has good transmission properties in the THz frequency band. One skilled in the art will be aware that the first preferred embodiment of the present disclosure used in the package of the chip 702 and the carrier 701 can be applied to the package of chips as well.

Figure 10A:
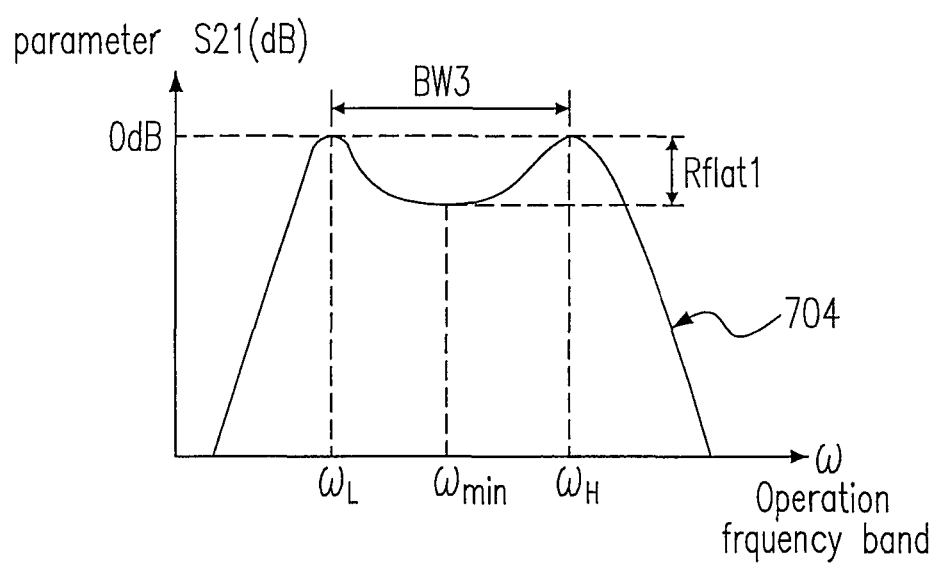
FIG. 10(a) is a schematic diagram showing the gain band of the resonant coupling network of the present disclosure.

Please refer to FIG. 10(a), which is a schematic diagram showing the gain band of the resonant coupling network 703 of the present invention. In FIG. 10(a), the horizontal axis shows the operation frequency band of the resonant coupling network 703, and the vertical axis shows the gain of the parameter S21, wherein $\omega_L$ and $\omega_H$ are two frequencies at the gain peaks, and $\omega_{min}$ represents the frequency with the minimum gain between the two gain-peak frequencies $\omega_L$ and $\omega_H$. Based on FIG. 10(a) illustrating features of the gain band of the forward gain, one skilled in the art will appreciate the features of the gain bands of reverse gains. The resonant coupling network 703 has a M-like signal gain band 704, which includes two gain-peak frequencies $\omega_L$ and $\omega_H$, and a frequency $\omega_{min}$ between the two gain-peak frequencies $\omega_L$ and $\omega_H$ with a gain lower than that at $\omega_L$ or $\omega_H$. The M-like signal gain band 704 further includes a bandwidth BW3 and a signal gain flatness Rflat1. The signal gain flatness Rflat1 is determined by the gain difference between $\omega_{min}$ and $\omega_L$ and the gain difference between $\omega_{min}$ and $\omega_H$.

Please refer to FIG. 7(c). The first resonator 7011 and the second resonator 7021 have a mutual inductance M1 and a coupling capacitance $C_C$ existing therebetween. The value of the mutual inductance M1 is directly proportional to the length $L_{M1}$ and the width $W_{M1}$ of the first split-rectangular conducting wire 741. Also, the value of the mutual inductance M1 is directly proportional to the length $L_{M2}$ and the width $W_{M2}$ of the second split-rectangular conducting wire 742. In addition, the value of the coupling capacitance $C_C$ is directly proportional to the thickness $T_{M1}$ of the first split-rectangular conducting wire 741 and the thickness $T_{M2}$ of the second split-rectangular conducting wire 742. In addition, the length $L_{M1}$ and the width $W_{M1}$ of the first split-rectangular conducting wire 741 are directly proportional to the value of the equivalent inductor $L_S$. Also, the length $L_{M2}$ and the width $W_{M2}$ of the second split-rectangular conducting wire 742 are directly proportional to the value of the equivalent inductor $L_P$. In addition, the thickness $T_{M1}$ of the first split-rectangular conducting wire 741 is directly proportional to the capacitance of the equivalent capacitor $C_S$, and the thickness $T_{M2}$ of the second split-rectangular conducting wire 742 is directly proportional to the capacitance of the equivalent capacitor $C_P$. Please refer to FIGS. 7(c) and 10(a). The bandwidth BW3 is associated with the mutual inductance M1 and the coupling capacitance $C_C$, and the signal gain flatness Rflat1 is associated with a first quality factor parameter $Q_{LOADS}$ of the first resonator 7011 or a second quality factor parameter $Q_{LOADP}$ of the second resonator 7021, where the parameter $Q_{LOADS}$=the capacitance of the equivalent capacitor $C_S\times\omega_0\times$the impedance of the load $Z_S$, the parameter $Q_{LOADP}$=the capacitance of the equivalent capacitor $C_P\times\omega_0\times$the load $Z_P$, $Q_{LOADS}$=$Q_{LOADP}$, and $W_0$=1/((the inductance of the equivalent inductor $L_P\times$the capacitance of the equivalent capacitor $C_P)\times(1-k^2))^{1/2}$ or $\omega_0$=1/((the inductance of the equivalent inductor $L_S\times$the capacitance of the equivalent capacitor $C_S)\times(1-k^2))^{1/2}$. The parameter k is a function of the mutual inductance M1 and the coupling capacitance $C_C$. Specifically, the parameter k is directly proportional to either the coupling capacitance $C_C$ or the mutual inductance M1. Based on the above, the mutual inductance M1 can be adjusted by adjusting the widths $W_{M1}$ and $W_{M2}$ or the lengths $L_{M1}$ and $L_{M2}$, and the coupling capacitance $C_C$ can be adjusted by adjusting the thickness $T_{M1}$ of the first split-rectangular conducting wire 741 and the thickness $T_{M2}$ of the second split-rectangular conducting wire 742.

Figure 10B:
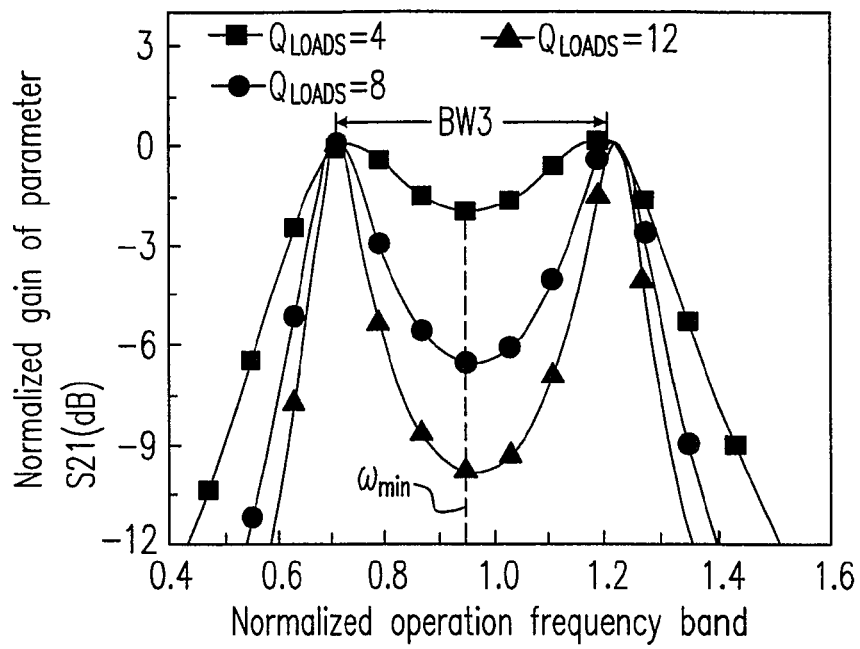
FIG. 10(b) is a schematic diagram showing relationships between signal gain flatness Rflat1 and parameter $Q_{LOADS}$.

Please refer to FIG. 10(b), which is a schematic diagram showing relationship between signal gain flatness Rflat1 and parameter $Q_{LOADS}$. The horizontal axis shows the normalized operation frequency band of the resonant coupling network 703. The vertical axis represents the normalized gain of the parameter S21. $\omega_{min}$ denotes the frequency with a minimum gain between the two gain-peak frequencies $\omega_L$ and $\omega_H$. As shown in FIG. 10(b), the larger the parameter $Q_{LOADS}$ is, the larger will be the slope of the curve between the two gain-peak frequencies $\omega_L$ and $\omega_H$, which represents that the signal gain flatness Rflat1 is not flat. A flat gain with a small gain variation is desired, and thus in FIG. 10(b), the parameter $Q_{LOADS}$ is preferred to be 4.

Figure 10C:
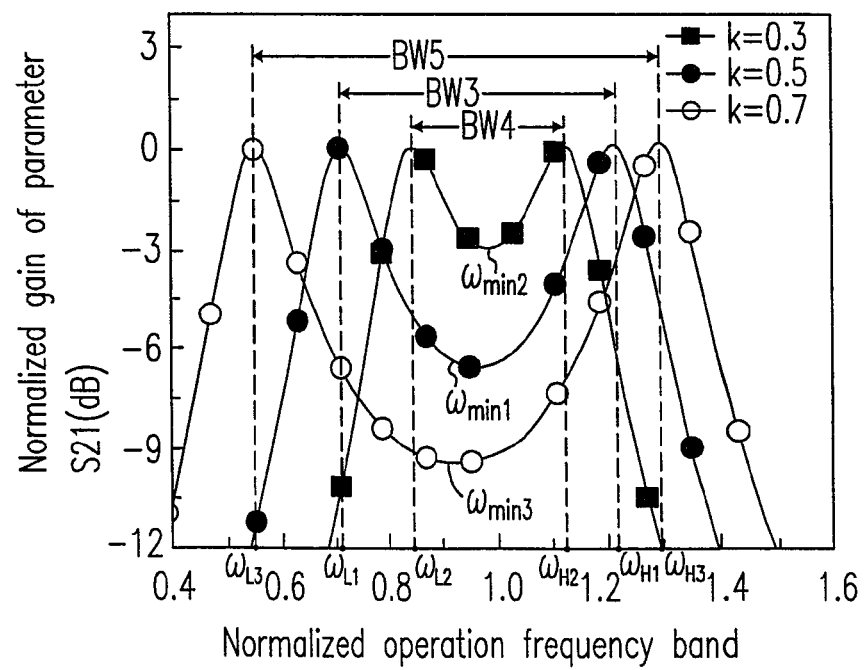
FIG. 10(c) is a schematic diagram showing relationships between bandwidth and parameter k.

Please refer to FIG. 10(c), which is a schematic diagram showing relationship between bandwidth and parameter k. The frequencies $\omega_{min1}$, $\omega_{min2}$ and $\omega_{min3}$ respectively represent the frequencies with the minimum gains between two gain-peak frequencies $\omega_{L1}$ and $W_{H1}$, $\omega_{L2}$ and $\omega_{H2}$, and $\omega_{L3}$ and $\omega_{H3}$. The bandwidths between two gain-peak frequencies $\omega_{L1}$ and $\omega_{H1}$, $\omega_{L2}$ and $\omega_{H2}$, and $\omega_{L3}$ and $\omega_{H3}$ are BW3, BW4 and BW5, respectively. With the increase of the parameter k from 0.3 to 0.5 to 0.7, the bandwidth is increased from BW4 to BW3 to BW5. The value of the parameter k can be increased by increasing the width WM1, the length $L_{M1}$ or the thickness $T_{M1}$ of the first split-rectangular conducting wire 741 or the width $W_{M2}$, the length $L_{M2}$ or the thickness $T_{M2}$ of the second split-rectangular conducting wire 742. However, it is preferred that the first and the second split-rectangular conducting wires have symmetric shapes to have a better effect of a common virtual ground. In order to have a wide range of bandwidth and a better gain property, the flatness of signals between $\omega_L$, $\omega_H$ should be stabilized. By using the adjustment manner above, the bandwidth and gain properties of the broadband signals Sig1_In and Sig1_Out can be optimized.

Specifically, in order to achieve good gain flatness of the M-like signals, while also maintaining a wide operation frequency band, the length $L_{M1}$ and the width $W_{M1}$ of the first split-rectangular conducting wire 741 and the length $L_{M2}$ and the width $W_{M2}$ of the second split-rectangular conducting wire 742 can be increased to increase the mutual inductance M1, and the coupling capacitance $C_C$ can be increased by increasing the thickness $T_{M1}$ of the first split-rectangular conducting wire 741 and the thickness $T_{M2}$ of the second split-rectangular conducting wire 742. The increase in the mutual inductance M1 and the coupling capacitance $C_C$ will cause an increase in the value of the parameter k, but will also cause an increase in the parameter $Q_{LOADS}$ or $Q_{LOADS}$, which will lead to the degradation of the signal gain flatness Rflat1. Therefore, the parameters k, $Q_{LOADS}$ and $Q_{LOADS}$ should be adjusted properly to obtain the optimal effect.

Figure 10D:
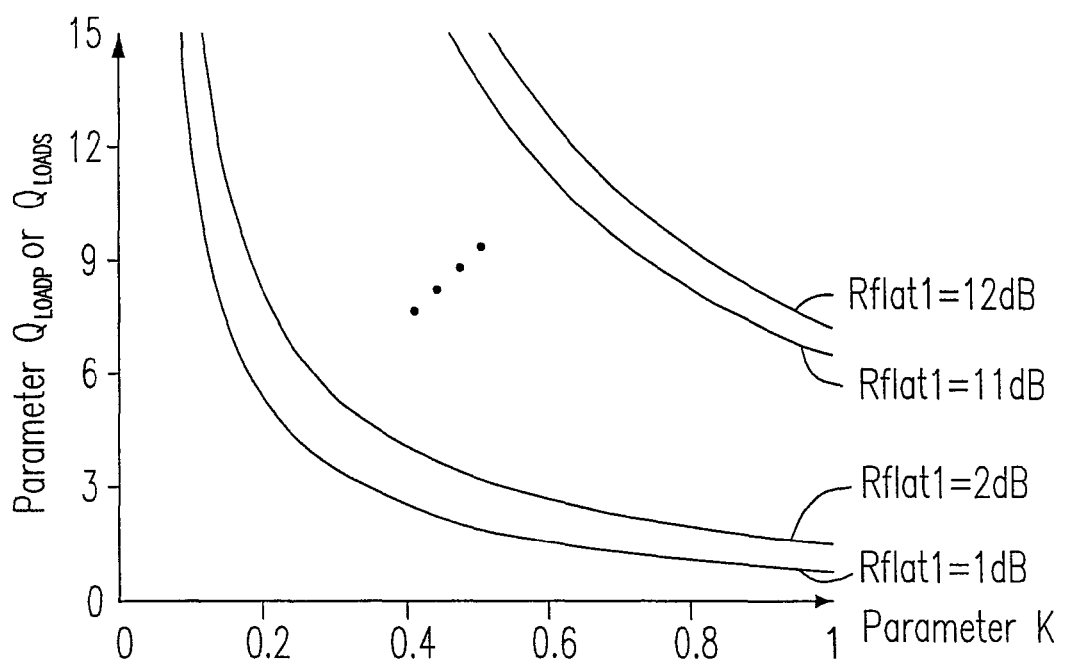
FIG. 10(d) is a schematic diagram showing relationships among Rflat1, parameter k and parameter $Q_{LOADS}$ or parameter $Q_{LOADP}$.

Please refer to FIG. 10(d), which is a schematic diagram showing the relationship among Rflat1, parameter k and parameter $Q_{LOADS}$ or parameter $Q_{LOADP}$. The horizontal axis shows the parameter k, and the vertical axis represents either the parameter $Q_{LOADS}$ or parameter $Q_{LOADP}$. The parameter Rflat1 is a parameter that represents the signal gain flatness, i.e. the gain variation. Therefore, the parameter Rflat1 with a small value indicates a small variation in gain and thus a flat gain. Based on FIG. 10(d), it can be seen that the parameter k is inversely proportional to either the parameter $Q_{LOADS}$ or the parameter $Q_{LOADP}$.

When the broadband signals Sig1_In and Sig1_Out are in the frequency of hundreds of Gigahertz, the capacitor will have poor capacitance and even minor inductance. That is, such a capacitor has a low ratio of stored energy to consumed energy. In this case, an increase in the number of parallel capacitors is unlikely to generate better resonance characteristics. Therefore, the use of the parasitic capacitance inherent in the inductor itself as the capacitor connected to the inductor in the resonator can not only simplify the resonator structure, but is also favourable to the improvement of the resonance characteristic.

Figure 11A:
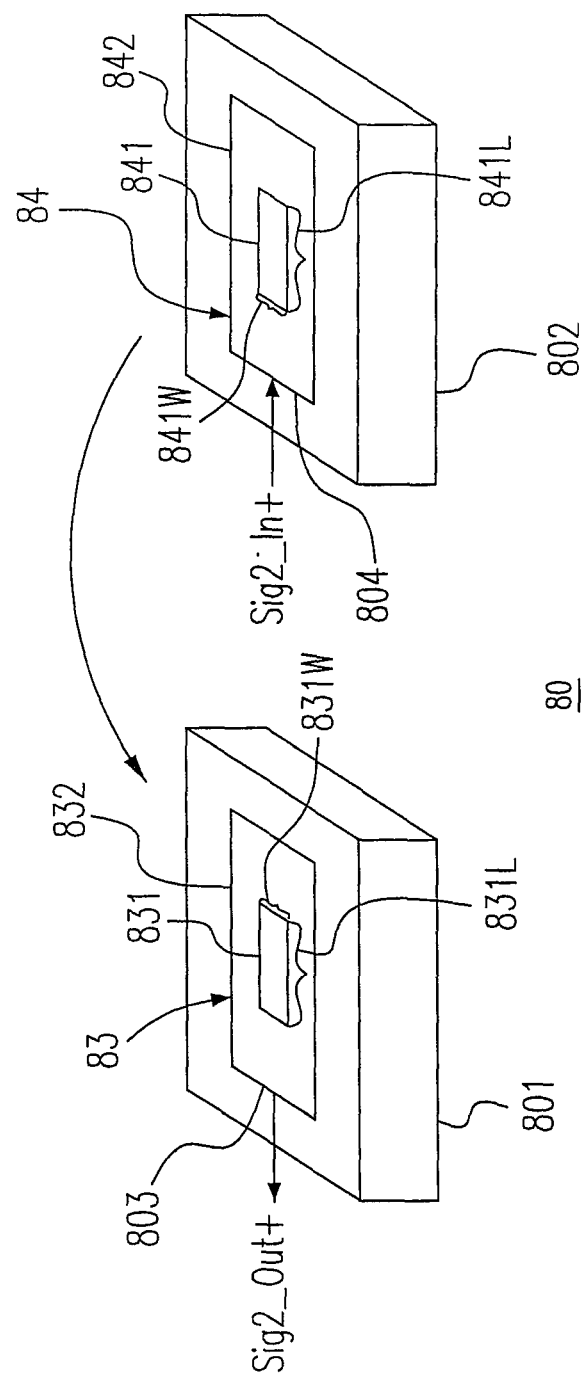
FIG. 11(a) is a schematic diagram showing a broadband connection structure according to a second preferred embodiment of the present disclosure.

Please refer to FIG. 11(a), which is a schematic diagram showing a broadband connection structure 80 according to a second preferred embodiment of the present disclosure. The broadband connection structure 80 includes a chip 801 and a chip 802, wherein the chip 802 is stacked on the chip 801 using a flip-chip method. The chip 801 includes a resonator 803, and the chip 802 includes a resonator 804, wherein there are a magnetic field and an electric field existing between the resonator 803 and the resonator 804. Coupling between the resonator 803 and the resonator 804 can be realized by the magnetic field coupling and the electric field coupling so as to transmit a broadband signal Sig2_In or Sig2_Out between the chip 801 and the chip 802. The broadband signal Sig2_In is an AC signal and composed of differential signals Sig2_In+ and Sig2_In−.

Figure 11B:
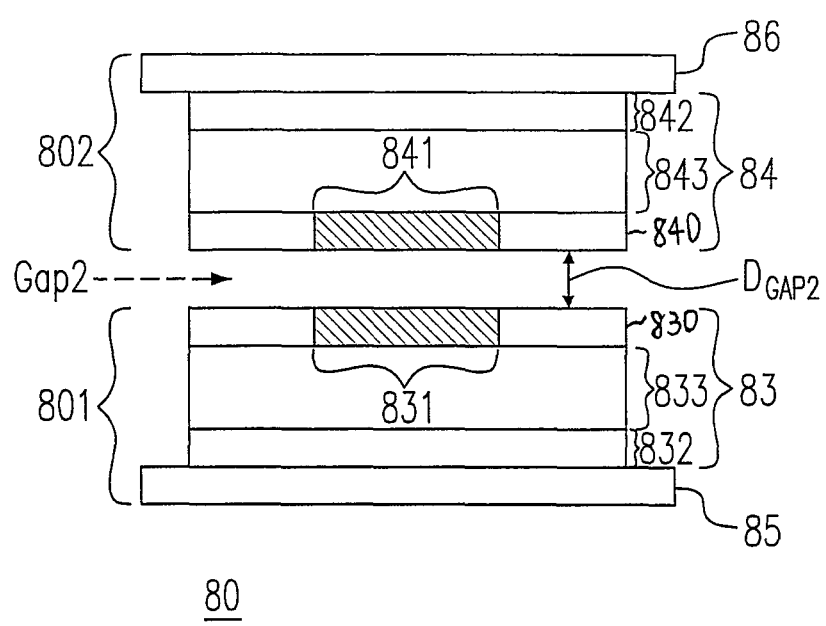
FIG. 11(b) is a sectional drawing of the broadband connection structure in FIG. 11(a) with the flip-chip stack of chips.

Please refer to FIG. 11(b), which is a sectional drawing of the broadband connection structure 80 in FIG. 11(a) with the flip-chip stack of chips. In the second preferred embodiment of the present disclosure, the broadband connection structure 80 is used to package the chip 801 and the chip 802. One skilled in the art will appreciate that the broadband connection structure 80 can be used to package a chip and a carrier as well. The broadband connection structure 80 has an equivalent circuit similar to that shown in FIG. 7(7). Please refer to FIGS. 11(a), 11(b) and 7(c). The resonator 803 includes an equivalent inductor $L_S$ and an equivalent capacitor $C_S$, and the resonator 804 includes an equivalent inductor $L_P$ and an equivalent capacitor $C_P$. The equivalent inductor $L_S$ is formed from a transmission line 83, which preferably is a microstrip. The transmission line 83 includes a conducting layer 830, a dielectric layer 833 and a substrate 832. The conducting layer 830 includes a conducting wire 831 serving as the equivalent inductor $L_S$. A parasitic capacitance formed by the conducting wire 831, the dielectric layer 833 and the substrate 832 acts as the equivalent capacitor $C_S$. The equivalent inductor $L_P$ is formed from a transmission line 84. The transmission line 84 includes a conducting layer 840, a dielectric layer 843 and a substrate 842. The conducting layer 840 includes a conducting wire 841. The conducting wire 841 acts as the equivalent inductor $L_P$. A parasitic capacitance formed by the conducting wire 841, the dielectric layer 843 and the substrate 842 acts as the equivalent capacitor $C_P$. The equivalent inductors $L_S$ and $L_P$ couple the broadband signals Sig2_In and Sig2_Out through the magnetic field existing therebetween.

As shown in FIG. 11(b), there is a gap, denoted as "Gap2", between the two chips 801 and 802 in the broadband connection structure 80. The distance ($D_{GAP2}$) of the Gap2 between the conducting wires 831 and 841 is very small. The conducting wire 831, the Gap2 and the conducting wire 841 form the equivalent coupling capacitor $C_C$ and use the electric field to couple the broadband signals Sig2_In and Sig2_Out. The differential signals constituting the broadband signal Sig2_In are input into the transmission line 84 and then coupled to the transmission line 83 through the magnetic field and the electric field to output the differential signals constituting the broadband signal Sig2_Out. Alternatively, the differential signals constituting the broadband signal Sig2_In are input into the transmission line 83 and then coupled to the transmission line 84 through the magnetic field and the electric field to output the differential signals constituting the broadband signal Sig2_Out. The transmission line 84 and the transmission line 83 have similar symmetric shapes, which are symmetric with a virtual plane. A virtual ground is formed on the virtual plane, so that the chip 801 and the chip 802 have the same ground potential, which can prevent a parasitic effect from being generated between the chip 801 and the chip 802.

In FIG. 11(b), the two transmission lines 83 and 84 form a resonant coupling network 87. The substrates 832 and 842 may be directly and electrically connected to the ground potential end. Alternatively, the substrates 832 and 842 may be electrically connected to portions 85 and 86 of the chips, respectively, with the portions 85 and 86 electrically connected to the ground potential end. The conducting wire 831 has a length, 831L, preferably equal to or smaller than ⅕, e.g. about ⅕~ 1/10, of a wavelength to which a lowest frequency in the operable bandwidth of this structure corresponds. The width 831W or the length 831L of the conducting wire 831 will affect the coupling capacitance $C_C$, and the length 831L of the conducting wire 831 will affect the inductance VLS of the equivalent inductor $L_S$. Similarly, the width 841W or the length 841L of the conducting wire 841 will affect the coupling capacitance $C_C$, and the length 841L of the conducting wire 841 will affect the inductance VLP of the equivalent inductor $L_P$. The conducting wire 831 and the conducting wire 841 have a very small size and their projections completely overlap in a vertical direction.

In the second preferred embodiment, the resonant coupling network 87 has an equivalent circuit the same as that shown in FIG. 7(c), a M-like signal gain band the same as that shown in FIG. 10(a), relationships between signal gain flatness Rflat1 and parameter $Q_{LOADS}$ the same as those shown in FIG. 10(b), and relationships between bandwidths of the broadband signals Sig2_In and Sig2_Out and parameter k the same as those shown in FIG. 10(c). Please refer to FIG. 11(b), FIGS. 10(a) to (c) and FIG. 7(c). The resonant coupling network 87 has an M-like signal gain band 704, and the descriptions therefor are similar to the illustrations for FIG. 10(a) and thus are omitted here. The value of the coupling capacitance $C_C$ between the first resonator 7011 and the second resonator 7021 of the resonant coupling network 87 is directly proportional to the width 831W of the conducting wire 831 and the width 841W of the conducting wire 841. The mutual inductance M1 between the first resonator 7011 and the second resonator 7021 of the resonant coupling network 87 is directly proportional to the length 831L and the length 841L. Either the length 831L or the length 841L is directly proportional to the values of the equivalent inductors $L_S$ and $L_P$. Either the width 831W or the width 841W is directly proportional to the values of the equivalent capacitor $C_S$ and $C_P$. The inductance of each of the equivalent inductors $L_S$ and $L_P$ can be adjusted by adjusting the length 831L of the conducting wire 831 and the length 841L of the conducting wire 841, and the capacitance of each of the equivalent capacitors $C_S$ and $C_P$ can be adjusted by adjusting the widths 831W and 841W. The mutual inductance M1 and the inductances of the equivalent inductors $L_S$ and $L_P$ are in direct proportion, and the capacitance of the coupling capacitance $C_C$ is directly proportional to the capacitances of the equivalent capacitors $C_S$ and $C_P$. Based on the above, one skilled in the art can realize how to adjust the values of the mutual inductance M1 and the coupling capacitance $C_C$ via the sizes of the conducting wires 831 and 841.

In order to achieve good gain flatness of the M-like signals, while maintaining a wide operation frequency band, the lengths 831L and 841L of the conducting wires 831 and 841 can be increased to increase the mutual inductance M1, and the widths 831W and 841W can also be increased to raise the coupling capacitance $C_C$. The increase in the mutual inductance M1 and the coupling capacitance $C_C$ will cause an increase in the parameter $Q_{LOADS}$ or parameter $Q_{LOADS}$, which will lead to a worse signal gain flatness Rflat1. However, the increase in the parameter $Q_{LOADS}$ or $Q_{LOADS}$, i.e. a worse signal gain flatness, is conducive to forming two distinct operation frequencies so as to transmit different signals at two different frequencies.

Figure 12:
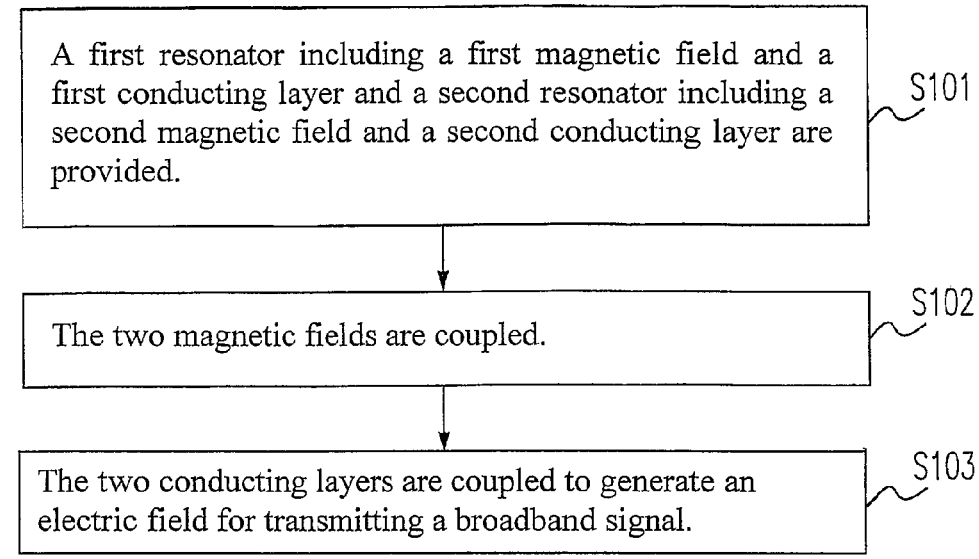
FIG. 12 is a schematic diagram showing a method for transmitting a broadband signal according to the present disclosure.

Please refer to FIG. 12, which is a schematic diagram showing a method for transmitting a broadband signal according to the present disclosure. In step S101, a first resonator 7011 or 803 including a first magnetic field and a first conducting layer 7015 or 830 is provided. In addition, a second resonator 7012 or 804 including a second magnetic field and a second conducting layer 7025 or 840 is provided. In step S102, the two magnetic fields are coupled. In step S103, the two conducting layers 7015/830 and 7025/840 are coupled to generate an electric field for transmitting a broadband signal Sig1_In, Sig1_Out, Sig2_In or Sig2_Out.

Figure 13:
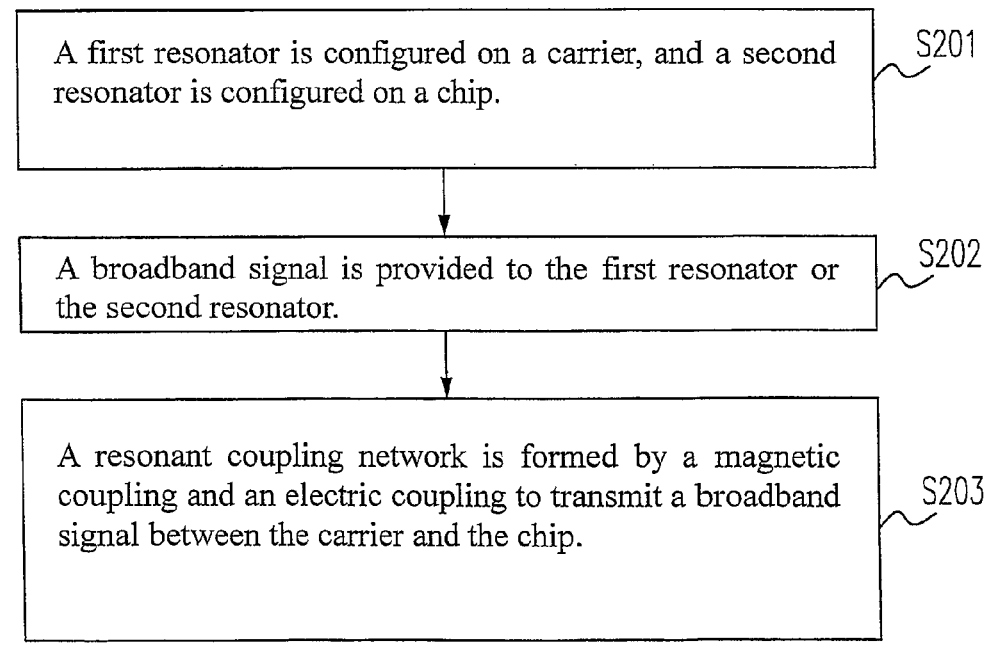
FIG. 13 is a schematic diagram showing a broadband connection method according to the present disclosure.

Please refer to FIG. 13, which is a schematic diagram showing a broadband connection method according to the present disclosure. In step S201, a first resonator 7011 is configured on a carrier 701, and a second resonator 7021 is configured on a chip 702. In step S202, a broadband signal is provided to the first resonator 7011 or the second resonator 7021. In step S203, a resonant coupling network 703 is formed by a magnetic coupling and an electric coupling between the first resonator 7011 and the second resonator 7021 to transmit a broadband signal Sig1_In or Sig1_Out between the carrier 701 and the chip 702. In step S203, the method to generate the magnetic coupling and the electric coupling can be realized by flipping over the chip 702 to make its top side face down and then configuring the chip 702 on the carrier 701.

Figure 14A:
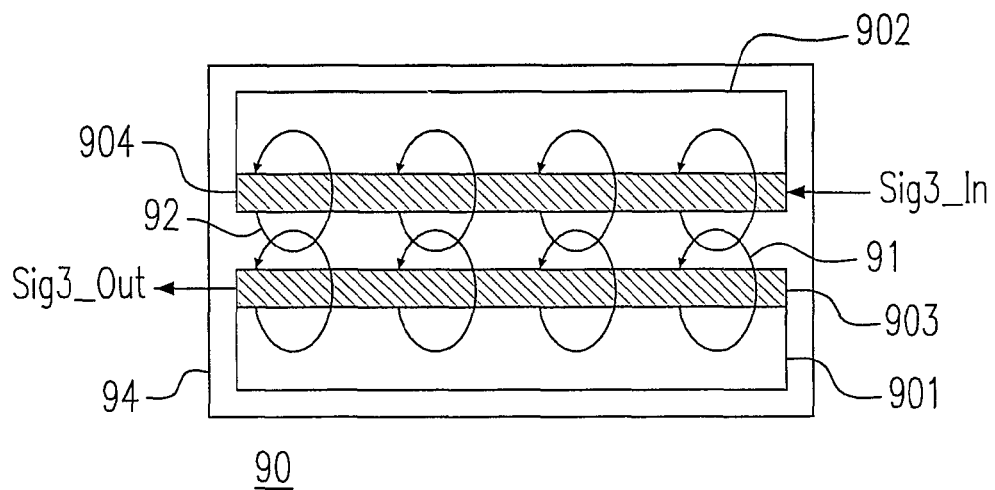
FIG. 14(a) is a schematic diagram showing magnetic field coupling of a third preferred embodiment of the present disclosure.
Figure 14B:
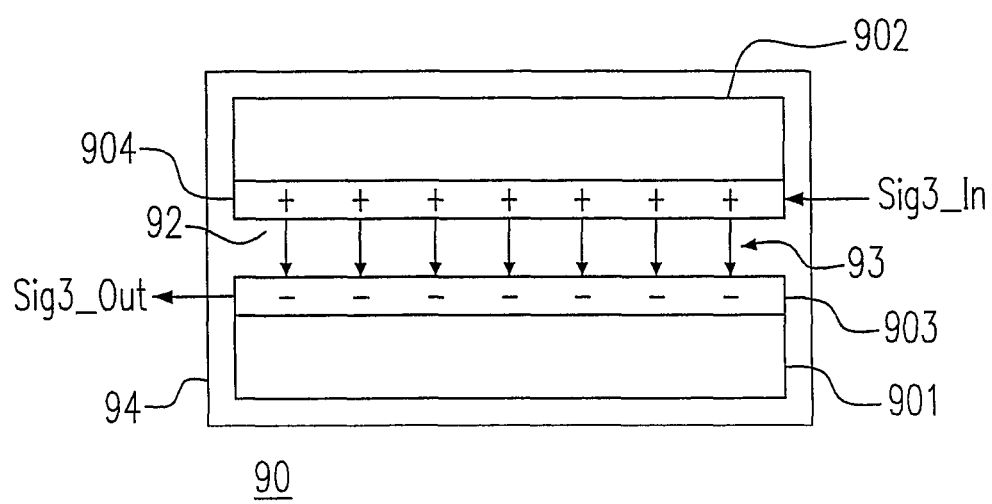
FIG. 14(b) is a schematic diagram showing electric field coupling of a third preferred embodiment of the present disclosure.

Please refer to FIGS. 14(*a*) and 14(*b*), which are schematic diagrams respectively showing the magnetic field coupling and electric field coupling of a third preferred embodiment of the present disclosure. The transmitting device 90 used to transmit a broadband signal Sig3_In or Sig3_Out includes a first resonator 901, a second resonator 902 and a device body 94 receiving the first resonator 901 and the second resonator 902. The first resonator 901 includes a first magnetic field 91 and a first conducting layer 903. The second resonator 902 being in communication with the first resonator 901 includes a second magnetic field 92 and a second conducting layer 904. The first conducting layer 903 and the second conducting layer 904 couple to each other to form therebetween an electric field 93, and the two magnetic fields 91 and 92 are coupled to each other to transmit the broadband signals Sig3_In and Sig3_Out.

The specific structure of the transmitting device 90 is the same as or similar to the first or second preferred embodiment of the present disclosure, as shown in FIGS. 8(*a*)-8(*b*) or FIG. 11(*b*), and has similar circuit features. As to how the shape or size of the conductors of the first and second conducting layers 903 and 904 affects the parameters k, $Q_{LOADS}$ and $Q_{LOADP}$, and how the adjustments of the parameters k, $Q_{LOADS}$ and $Q_{LOADP}$ affect the bandwidth of the broadband signals Sig3_In and Sig3_Out are described above and thus are omitted here.

Some embodiments of the present disclosure are described in the following.

1. A broadband connection structure comprises a carrier and a chip. The carrier includes a first resonator. The chip includes a second resonator and is configured on the carrier using a flip-chip method. The first resonator is connected to the second resonator via a magnetic field and an electric field existing therebetween to transmit a broadband signal between the carrier and the chip.

2. A broadband connection structure of Embodiment 1, wherein the first resonator includes a first equivalent inductor, and the carrier includes a first split-rectangular conducting wire constituting the first equivalent inductor; the second resonator includes a second equivalent inductor, and the chip further includes a second split-rectangular conducting wire constituting the second equivalent inductor; the first split-rectangular conducting wire has two first terminals, and the second split-rectangular conducting wire has two second terminals; and the broadband signal is a differential signal.

3. A broadband connection structure of any one of the above embodiments, wherein the first equivalent inductor and the second equivalent inductor couple the broadband signal via the magnetic field therebetween.

4. A broadband connection structure of any one of the above embodiments, wherein the differential signal is input to the first terminals, coupled to the second split-rectangular conducting wire via the magnetic field and the electric field and output from the second terminals.

5. A broadband connection structure of any one of the above embodiments, wherein the differential signal is input to the second terminals, coupled to the first split-rectangular conducting wire via the magnetic field and the electric field and output from the first terminals.

6. A broadband connection structure of any one of the above embodiments, further comprising: a virtual ground plane set between the first terminals and between the second terminals, and each of the first and second split-rectangular conducting wires is symmetric with respect to the virtual ground plane so that the carrier and the chip have an identical ground potential.

7. A broadband connection structure of any one of the above embodiments, wherein the first split-rectangular conducting wire has a length and a width, the broadband connection structure has an operable bandwidth, and one of the length and the width is less than one-fifth of a wavelength to which a lowest frequency in the operable bandwidth corresponds.

8. A broadband connection structure of any one of the above embodiments, wherein the carrier further includes a first substrate and a first insulating layer between the first substrate and the first split-rectangular conducting wire; the chip further includes a second substrate and a second insulating layer between the second substrate and the second split-rectangular conducting wire; and the first substrate and the second substrate are formed from one of an identical material and different materials.

9. A broadband connection structure of any one of the above embodiments, wherein the first resonator further includes a first equivalent capacitor formed from the first split-rectangular conducting wire, the first insulating layer and the first substrate; and the second resonator further includes a second equivalent capacitor formed from the second split-rectangular conducting wire, the second insulating layer and the second substrate constitute.

10. A broadband connection structure of any one of the above embodiments, wherein the first split-rectangular conducting wire has a first parasitic capacitance; the second split-rectangular conducting wire has a second parasitic capacitance; the first resonator further includes a first equivalent capacitor formed from the first parasitic capacitance; and the second resonator further includes a second equivalent capacitor formed from the second parasitic capacitance.

11. A broadband connection structure of any one of the above embodiments further comprises a gap between the carrier and the chip; and an equivalent coupling capacitor formed from the first split-rectangular conducting wire, the second split-rectangular conducting wire and the gap and coupling the broadband signal via the electric field.

12. A broadband connection structure of any one of the above embodiments further comprises a first chip including a first resonator; and a second chip including a second resonator and placed on the first chip by a flip-chip method, wherein the first resonator is coupled to the second resonator by a magnetic field and an electric field existing therebetween to transmit a broadband signal between the first chip and the second chip.

13. A broadband connection structure of Embodiment 12, wherein the first resonator includes a first equivalent inductor and a first equivalent capacitor, and the first chip further includes a first transmission line. The first transmission line includes a first conducting wire acting as the first equivalent inductor, a first substrate, and a first dielectric layer. The first chip has a first parasitic capacitance formed from the first conducting wire, the first dielectric layer and the first substrate and acting as the first equivalent capacitor.

14. A broadband connection structure of any one of Embodiments 12-13, wherein the second resonator includes a second equivalent inductor and a second equivalent capacitor. The second chip further includes a second transmission line, and the second transmission line includes a second conducting wire acting as the second equivalent inductor, a second substrate, and a second dielectric layer. The second chip has a second parasitic capacitance formed from the second conducting wire, the second dielectric layer and the second substrate and acting as the second equivalent capacitor.

15. A broadband connection structure of any one of Embodiments 12-14 further comprises a gap between the first and the second chips; and an equivalent coupling capacitor formed from the first conducting wire, the gap and the second conducting wire and coupling the broadband signal via the electric field.

16. A broadband connection structure of any one of Embodiments 12-15, wherein the first resonator having a first quality factor parameter is coupled to the second resonator having a second quality factor parameter to form a resonant coupling network; the resonant coupling network has an M-like signal gain band including a bandwidth and a signal gain flatness; the first resonator and the second resonator have a mutual inductance therebetween and a coupling capacitance; and the bandwidth is a function of the mutual inductance and the coupling capacitance, the signal gain flatness is a function of one of the first quality factor parameter and the second quality factor parameter.

17. A broadband connection method comprises steps of configuring a first resonator on a carrier and a second resonator on a chip and forming a resonant coupling network through a magnetic coupling and an electric coupling between the first resonator and the second resonator to transmit a broadband signal between the carrier and the chip.

18. A broadband connection method of Embodiment 17 further comprises steps of providing a first split-rectangular conducting wire on the carrier to act as a first equivalent inductor, and providing a second split-rectangular conducting wire on the chip to act as a second equivalent inductor, placing the chip on the carrier using a flip-chip method, and forming the magnetic coupling using the first equivalent inductor and the second equivalent inductor.

19. A broadband connection method of any one of Embodiments 17-18 further comprises steps of configuring a first conducting layer in the first resonator, configuring a second conducting layer in the second resonator, and coupling the first conducting layer and the second conducting layer to form an electric field.

20. A broadband connection method of any one of Embodiments 17-19, wherein the first resonator has a first magnetic field, and the second resonator has a second magnetic field. The method further comprises a step of coupling the first magnetic field and the second magnetic field.

While the disclosures here describe the terms of what is presently considered to be the most practical and preferred embodiments, it is to be understood that the disclosure needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A broadband connection structure, comprising:
a carrier including a first resonator; and
a chip including a second resonator and configured on the carrier in a flip-chip method, wherein the first resonator is connected to the second resonator via a magnetic field and an electric field existing therebetween to transmit a broadband signal between the carrier and the chip, the first resonator includes a first equivalent inductor, the carrier includes a first split-rectangular conducting wire constituting the first equivalent inductor, the first split-rectangular conducting wire has a length and a width, the broadband connection structure has an operable bandwidth, and one of the length and the width is less than one-fifth of a wavelength to which a lowest frequency in the operable bandwidth corresponds.

2. A broadband connection structure as claimed in claim 1, wherein:
the second resonator includes a second equivalent inductor, and the chip further includes a second split-rectangular conducting wire constituting the second equivalent inductor;

the first split-rectangular conducting wire has two first terminals, and the second split-rectangular conducting wire has two second terminals; and the broadband signal is a differential signal.

3. A broadband connection structure as claimed in claim 2, wherein the first equivalent inductor and the second equivalent inductor couple the broadband signal via the magnetic field therebetween.

4. A broadband connection structure as claimed in claim 2, wherein the differential signal is input to the first terminals, coupled to the second split-rectangular conducting wire via the magnetic field and the electric field and output from the second terminals.

5. A broadband connection structure as claimed in claim 2, wherein the differential signal is input to the second terminals, coupled to the first split-rectangular conducting wire via the magnetic field and the electric field and output from the first terminals.

6. A broadband connection structure as claimed in claim 2, further comprising:
a virtual ground plane set between the first terminals and between the second terminals, and each of the first and second split-rectangular conducting wires is symmetric with respect to the virtual ground plane so that the carrier and the chip have an identical ground potential.

7. A broadband connection structure as claimed in claim 2, wherein:
the carrier further includes:
a first substrate; and
a first insulating layer between the first substrate and the first split-rectangular conducting wire;
the chip further includes:
a second substrate; and
a second insulating layer between the second substrate and the second split-rectangular conducting wire; and
the first substrate and the second substrate are formed from one of an identical material and different materials.

8. A broadband connection structure as claimed in claim 7, wherein:
the first resonator further includes a first equivalent capacitor formed from the first split-rectangular conducting wire, the first insulating layer and the first substrate; and
the second resonator further includes a second equivalent capacitor formed from the second split-rectangular conducting wire, the second insulating layer and the second substrate constitute.

9. A broadband connection structure as claimed in claim 2, wherein:
the first split-rectangular conducting wire has a first parasitic capacitance;
the second split-rectangular conducting wire has a second parasitic capacitance;
the first resonator further includes a first equivalent capacitor formed from the first parasitic capacitance; and
the second resonator further includes a second equivalent capacitor formed from the second parasitic capacitance.

10. A broadband connection structure as claimed in claim 2, further comprising:
a gap between the carrier and the chip; and
an equivalent coupling capacitor formed from the first split-rectangular conducting wire, the second split-rectangular conducting wire and the gap, and coupling the broadband signal via the electric field.

11. A broadband connection structure, comprising:
a first chip including a first resonator; and
a second chip including a second resonator and placed on the first chip by a flip-chip method, wherein the first resonator is coupled to the second resonator by a magnetic field and an electric field existing therebetween to transmit a broadband signal between the first chip and the second chip, wherein the first resonator includes a first equivalent inductor and a first equivalent capacitor, the first chip further includes a first transmission line including a first conducting wire acting as the first equivalent inductor, the first conducting wire has a length and a width, the broadband connection structure has an operable bandwidth, and one of the length and the width is less than one-fifth of a wavelength to which a lowest frequency in the operable bandwidth corresponds.

12. A broadband connection structure as claimed in claim 11, wherein:
the first transmission line further includes:
a first substrate, and
a first dielectric layer; and
the first chip has a first parasitic capacitance formed from the first conducting wire, the first dielectric layer and the first substrate and acting as the first equivalent capacitor.

13. A broadband connection structure as claimed in claim 12, wherein:
the second resonator includes a second equivalent inductor and a second equivalent capacitor;
the second chip further includes a second transmission line, and the second transmission line includes:
a second conducting wire acting as the second equivalent inductor,
a second substrate, and
a second dielectric layer; and
the second chip has a second parasitic capacitance formed from the second conducting wire, the second dielectric layer and the second substrate and acting as the second equivalent capacitor.

14. A broadband connection structure as claimed in claim 13, further comprising:
a gap between the first and the second chips; and
an equivalent coupling capacitor formed from the first conducting wire, the gap and the second conducting wire and coupling the broadband signal via the electric field.

15. A broadband connection structure as claimed in claim 11, wherein:
the first resonator having a first quality factor parameter is coupled to the second resonator having a second quality factor parameter to form a resonant coupling network;
the resonant coupling network has an M-like signal gain band including a bandwidth and a signal gain flatness;
the first resonator and the second resonator have a mutual inductance therebetween and a coupling capacitance; and
the bandwidth is a function of the mutual inductance and the coupling capacitance, the signal gain flatness is a function of one of the first quality factor parameter and the second quality factor parameter.

16. A broadband connection method, comprising steps of:
configuring a first resonator on a carrier and a second resonator on a chip; and
forming a resonant coupling network by a magnetic coupling and an electric coupling between the first resonator and the second resonator to transmit a broadband signal between the carrier and the chip and providing a first split-rectangular conducting wire on the carrier to act as a first equivalent inductor, wherein the first split-rectangular conducting wire has a length and a width, and one of the length and the width is less than one-fifth of a wavelength to which a lowest frequency in an operable bandwidth corresponds.

17. A method as claimed in claim 16, further comprising steps of:

providing a second split-rectangular conducting wire on the chip to act as a second equivalent inductor;

placing the chip on the carrier by a flip-chip method; and forming the magnetic coupling by using the first equivalent inductor and the second equivalent inductor.

18. A method as claimed in claim 16, further comprising steps of:

configuring a first conducting layer in the first resonator;

configuring a second conducting layer in the second resonator; and coupling the first conducting layer and the second conducting layer to form an electric field.

19. A method as claimed in claim 16, wherein the first resonator has a first magnetic field, and the second resonator has a second magnetic field, the method further comprising a step of:

coupling the first magnetic field and the second magnetic field.

* * * * *